(12) United States Patent
Eid et al.

(10) Patent No.: US 12,136,577 B2
(45) Date of Patent: Nov. 5, 2024

(54) INTEGRATED CIRCUIT DIE PACKAGES INCLUDING A CONTIGUOUS HEAT SPREADER

(71) Applicant: Intel Corporation, Santa Clara, CA (US)

(72) Inventors: Feras Eid, Chandler, AZ (US); Joe Walczyk, Tigard, OR (US); Paul Diglio, Gaston, OR (US)

(73) Assignee: Intel Corporation, Santa Clara, CA (US)

( * ) Notice: Subject to any disclaimer, the term of this patent is extended or adjusted under 35 U.S.C. 154(b) by 986 days.

(21) Appl. No.: 16/911,820

(22) Filed: Jun. 25, 2020

(65) Prior Publication Data

US 2021/0407877 A1    Dec. 30, 2021

(51) Int. Cl.

| | |
|---|---|
| *H01L 23/31* | (2006.01) |
| *H01L 21/56* | (2006.01) |
| *H01L 25/065* | (2023.01) |
| *H01L 25/07* | (2006.01) |
| *H01L 25/075* | (2006.01) |
| *H01L 25/18* | (2023.01) |

(52) U.S. Cl.
CPC .......... *H01L 23/3135* (2013.01); *H01L 21/56* (2013.01); *H01L 23/3107* (2013.01); *H01L 25/0655* (2013.01); *H01L 25/072* (2013.01); *H01L 25/0753* (2013.01); *H01L 25/18* (2013.01); *H01L 2924/181* (2013.01)

(58) Field of Classification Search
CPC . H01L 23/3135; H01L 25/0655; H01L 25/18; H01L 21/56; H01L 23/36; H01L 23/3107; H01L 25/072; H01L 25/0753; H01L 2924/181
See application file for complete search history.

(56) References Cited

U.S. PATENT DOCUMENTS

| | | | | |
|---|---|---|---|---|
| 9,142,480 | B2* | 9/2015 | Houle | H01L 23/24 |
| 10,818,569 | B2* | 10/2020 | Oh | H01L 25/0655 |
| 10,978,373 | B2* | 4/2021 | Ku | H01L 24/24 |
| 11,784,108 | B2* | 10/2023 | Eid | H03H 9/0542 |
| | | | | 257/713 |
| 2005/0151554 | A1* | 7/2005 | Rae | H01L 23/36 |
| | | | | 257/E23.101 |
| 2005/0274487 | A1* | 12/2005 | Goth | F28F 9/001 |
| | | | | 257/E23.088 |
| 2013/0119535 | A1* | 5/2013 | Joshi | H01L 23/42 |
| | | | | 257/737 |

(Continued)

*Primary Examiner* — Alonzo Chambliss
(74) *Attorney, Agent, or Firm* — Essential Patents Group, LLP

(57) ABSTRACT

A contiguous integrated heat spreader suitable for an integrated circuit (IC) die package. Heat spreader material may be deposited with a high throughput additive manufacturing (HTAM) technique directly upon a surface of an IC die, and over a portion of a package substrate beyond an edge of the IC die. The contiguous heat spreader may have high thermal conductivity and offer low thermal resistance in absence of any intervening thermal interface material (TIM). The contiguous heat spreader may span multiple IC die and accommodate different die heights. The heat spreader may be contiguous with multiple die. Heat spreader material may be absent where thermal breaks within the heat spreader are advantageous.

22 Claims, 13 Drawing Sheets

(56) References Cited

U.S. PATENT DOCUMENTS

| | | | |
|---|---|---|---|
| 2013/0341773 A1* | 12/2013 | Bauer | H01L 25/0655 |
| | | | 257/659 |
| 2015/0076682 A1* | 3/2015 | Wu | H01L 24/97 |
| | | | 257/693 |
| 2015/0318228 A1* | 11/2015 | Ito | H01L 25/0655 |
| | | | 438/126 |
| 2015/0340303 A1* | 11/2015 | Oh | H01L 25/071 |
| | | | 438/109 |
| 2020/0211924 A1* | 7/2020 | Schultz | G01R 31/2877 |
| 2021/0043543 A1* | 2/2021 | Eid | H01L 23/427 |
| 2023/0071542 A1* | 3/2023 | Hung | H01L 23/42 |

\* cited by examiner

INTEGRATED CIRCUIT DIE PACKAGES INCLUDING A CONTIGUOUS HEAT SPREADER

BACKGROUND

Integrated circuit (IC) packaging is a stage of microelectronic device manufacture in which an IC that has been fabricated on a die (or chip) comprising a semiconducting material is encapsulated in an "assembly" or "package" that can protect the IC from physical damage and support electrical contacts that connect the IC to a host circuit board or another package. In the IC industry, the process of fabricating a package is often referred to as packaging, or assembly.

A number of IC packaging technologies include a heat spreader to convey heat laterally (and vertically) over an area larger than the IC die, in route to a system-level thermal solution, such as a heat exchanger (e.g., heat pipe, microfluidic cooler, etc.). FIG. 1A illustrates a partially exploded view of a conventional IC die package 101 that includes an integrated heat spreader (IHS) 140. A cross-sectional view through IC die package 101 is further illustrated in FIG. 1B. As shown, a thermal interface material (TIM) 105 is between an IC die 120 and integrated heat spreader (IHS) 140. TIM 105 has an area (e.g., X-Y plane) that defines a footprint of a preformed "pad" or where a viscous polymer, often referred to as a "thermal grease," is applied. One TIM surface is in direct contact with a surface of IC die 120 while a second surface is to be in direct contact with an interior surface of IHS 140.

IHS 140 extends over a portion of package substrate 130, which may further include any number of conductive routing layers (not depicted). As further illustrated, IC die 120 is electrically interconnected to substrate 130 by conductive first level interconnects (FLI) 122. FLI 122 are embedded in underfill 125 and may be any interconnects known to be suitable for electrically coupling an IC die, such as solder features (e.g., solder balls, solder bumps, microbumps, pillars, etc.).

IHS 140 may be of one or more materials having high thermal conductivity (i.e., having a high thermal conductivity coefficient κ with SI units of W m$^{-1}$K$^{-1}$). IHS 140 may have any thickness suitable to provide rigidity and/or protection to the underlying IC die 120 and TIM 105. IHS 140 has a surface larger than the footprint of IC die 120 allowing for sidewall portions of IHS 140 to enclose IC die 120 and TIM 105. A foot of IHS 140 may be affixed to a package substrate 130 with an adhesive sealant 135 surrounding IC die 120.

Much effort has gone into developing TIMs with higher thermal conductivity, such as solder TIM instead of polymer TIM, and/or reducing the bond line thickness (BLT) of a TIM. Even TIMs of high thermal conductivity are typically still less thermally conductive than silicon or copper (which is a common material for IHS 140). A TIM can also often suffer from instability as thermal cycles are experienced by package 101 during reliability testing or device operation. For example, a TIM may flow out, dry out, delaminate, or crack, as regions of package 101 strain differently in response to thermal cycles. There is therefore a lower limit to BLT associated with package warpage and mechanical considerations aimed at preventing high stresses and failure of the TIM. A TIM also has a finite contact resistance with both IC die 120 and IHS 140, which may not improve even if the bulk conductivity of a TIM is improved.

Overcoming one or more of these issues with package 101 would therefore be commercially advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1A:
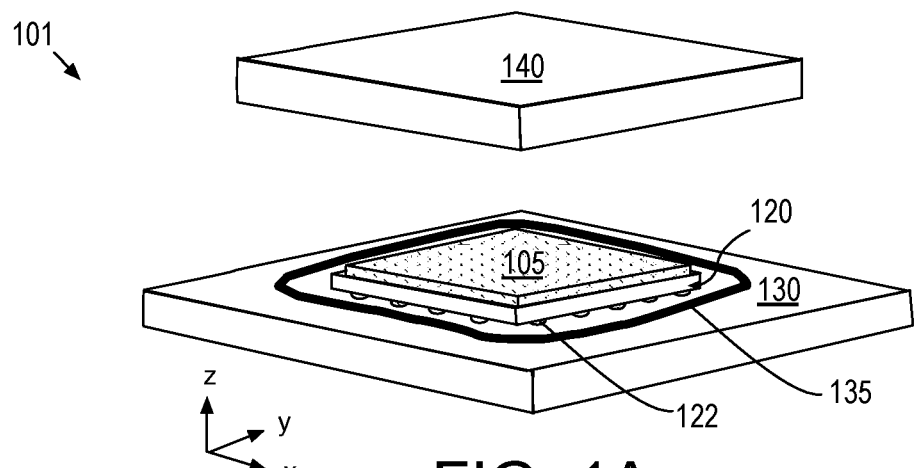
FIG. 1A illustrates an exploded isometric view of an IC die-heat spreader assembly, in accordance with convention.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive or incompatible.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicate that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or layer disposed over or under another may be directly in contact or there may be one or more intervening materials or layers. Moreover, one material or layer disposed between two materials or layers may be directly in contact with the two materials or layers, or there may be one or more intervening materials or layers. In contrast, a first material or material "on" a second material or layer is in direct contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Figure 1B:
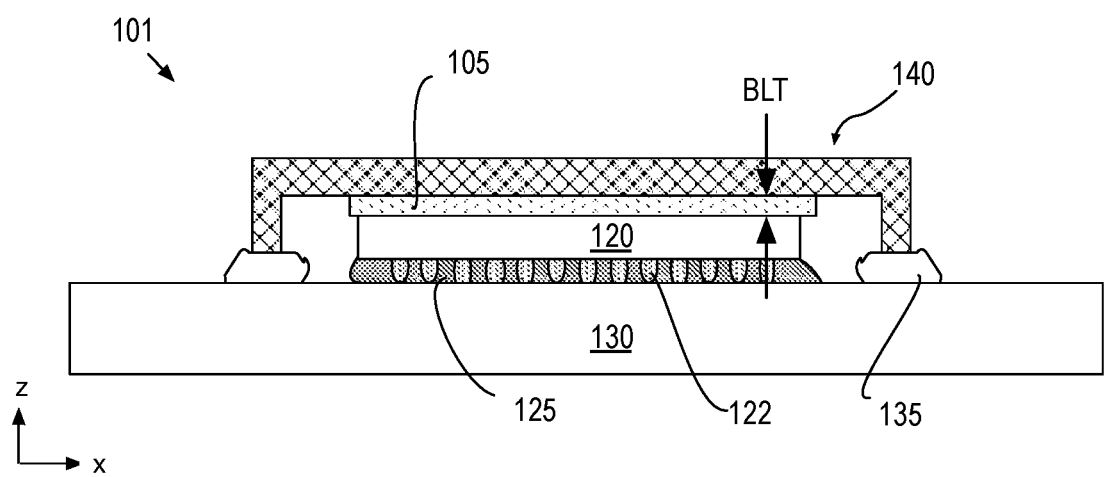
FIG. 1B illustrates a cross-sectional view of the IC die-heat spreader assembly shown in FIG. 1A, in accordance with convention.

Described herein are examples of an IC die package including a contiguous heat spreader. In the examples below, a heat spreader material is directly deposited upon a surface of an IC die and beyond an edge of the IC die. In contrast to a conventional "integrated" heat spreader (e.g., as introduced above in reference to FIG. 1A-1B) that is thermally coupled to an IC die through an intervening TIM, a "contiguous" heat spreader in accordance with embodiments herein is in direct contact with the IC die. An IC package including a contiguous heat spreader therefore lacks any intervening TIM. The integration of a heat spreader and an IC die package is thereby advanced from an integrated assembly of discrete components interfaced through a TIM to a contiguous integration of the heat spreader with one or more IC dies of the package. Accordingly, thermo-mechanical issues attributable to the presence of a TIM between a heat spreader and an IC die can be avoided. For example, thermal resistance associated with TIM may be eliminated, reducing the overall package thermal resistance and allowing better heat removal and improved IC die performance. Package assembly steps and material costs associated with procuring and attaching a discrete heat spreader may also be avoided.

Through selection of materials, as well as through the processes enlisted to form a contiguous heat spreader, package assemblies including a contiguous heat spreader may have improved thermal performance. In accordance with some embodiments, a high throughput additive manufacturing (HTAM) process is employed to form the heat spreader material upon a surface of the IC die. The HTAM process may provide very high deposition rates and may be suitable for depositing a wide variety of materials having high thermal conductivity.

In some embodiments further described below, a frame, or base, material may be deposited upon a package substrate around a periphery of the IC die(s) in preparation for an HTAM formation of the heat spreader material upon both the IC die(s) and upon the frame material. The frame material may be selected to have mechanical and/or thermal properties advantageous for interfacing the heat spreader material to a package substrate, and thereby enabling the heat spreader to have any footprint desired for laterally spreading heat beyond the footprint of the IC die(s).

In some embodiments further described below, a thickness of the heat spreader material may vary over its footprint, for example to planarize laterally adjacent IC dies of different die thicknesses and/or package interconnect heights. A thickness of the heat spreader material may vary to provide one or more thermal brakes between laterally adjacent IC dies, that may, for example, have different power dissipation and/or thermal sensitivity.

Figure 2:
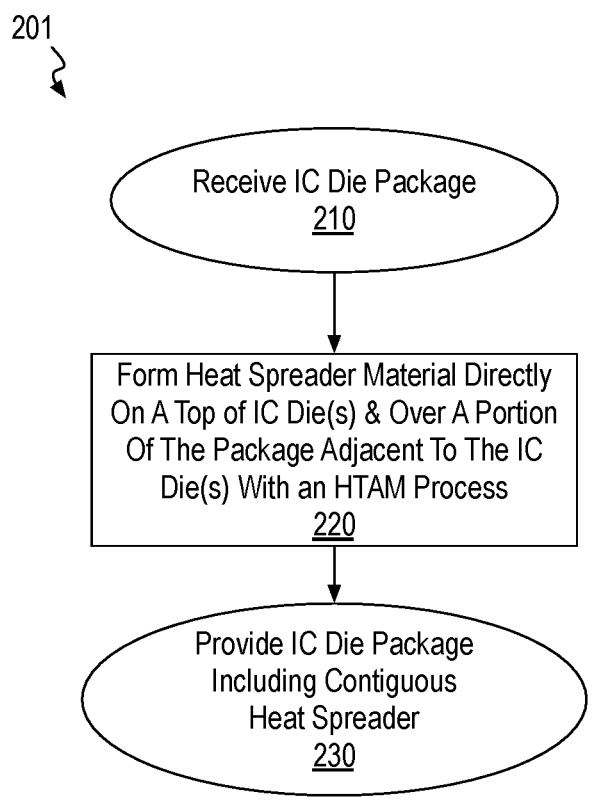
FIG. 2 is a flow diagram of methods for forming a contiguous heat spreader suitable for integration into an IC die package assembly, in accordance with some embodiments.

FIG. 2 illustrates a flow diagram of methods 201 for forming an IC die package with a contiguous heat spreader, in accordance with some embodiments. Methods 201 begin with receiving an IC die package at input 210. The IC die package received may be fabricated and/or assembled upstream of methods 201 to any specifications. In exemplary embodiments, the IC die package includes one or more IC dies interconnected to a package substrate that extends beyond an edge of the IC dies. At least one surface of the IC dies, for example a surface opposite the package substrate, is advantageously exposed.

At block 220, a heat spreader material is deposited over the IC die(s), and over some portion of the package substrate adjacent to the IC die(s) so that the footprint of the heat spreader material is larger than that of the IC die(s). The footprint of the heat spreader material may be as large as the package substrate, or nearly so. In advantageous embodiments, the heat spreader material is deposited by an HTAM process, such as, but not limited to spray deposition techniques. As used herein, HTAM processes entail a dispense of one or more source powders upon a workpiece surface where the powder(s) coalesce into the heat spreader material. With such deposition techniques, the heat spreader material may be rapidly formed selectively upon any portion of an IC die package in an additive manner, and at high rates (e.g., 50 μm/sec, or more). As described further below, one or more spray nozzles may be scanned over the IC die package, depositing heat spreader material having high thermal conductivity along a path that substantially covers the IC die(s) and overlaps an edge and/or sidewall of the IC die(s).

The heat spreader material deposited at block 220 may have strong adhesion to the underlying IC die package surface(s). The heat spreader material may have a composition, and/or microstructure, and/or surface characteristic distinct from that of the underlying IC die package materials, and which advantageously has a high thermal conductivity. For example, the heat spreader material may have a composition with high thermal conductivity in an x-y plane over the IC die(s). By using HTAM processes to deposit the heat spreader material, a heat spreader that is contiguous with the IC die(s) may be fabricated at the IC die package level to any desired footprint and thickness that is suitable for a wide range of IC die package applications that may have a variety of different constraints on the package thickness and lateral dimensions.

Methods 201 complete at block 230 where the resulting IC die package including a contiguous heat spreader is provided, either as a saleable product (e.g., offered to a component supplier in microelectronics assembly supply chain) or as an internal precursor, for use in the further manufacture of an IC die package assembly.

Figure 3:
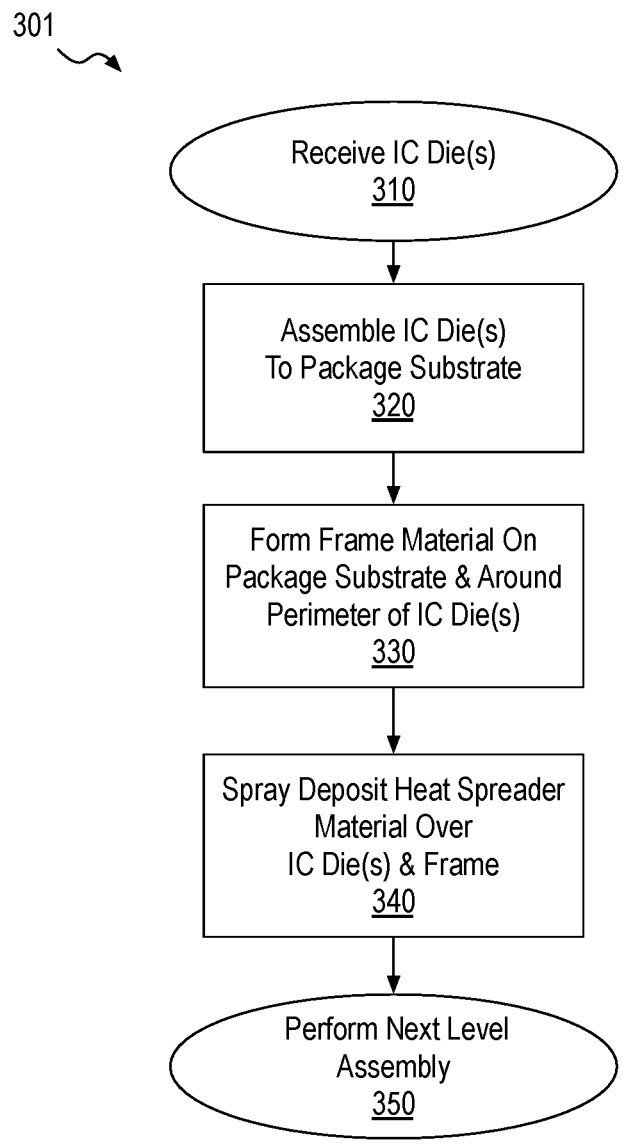
FIG. 3 is a flow diagram of methods of forming a contiguous heat spreader over an IC die-package substrate assembly, in accordance with some embodiments.
Figure 4A:
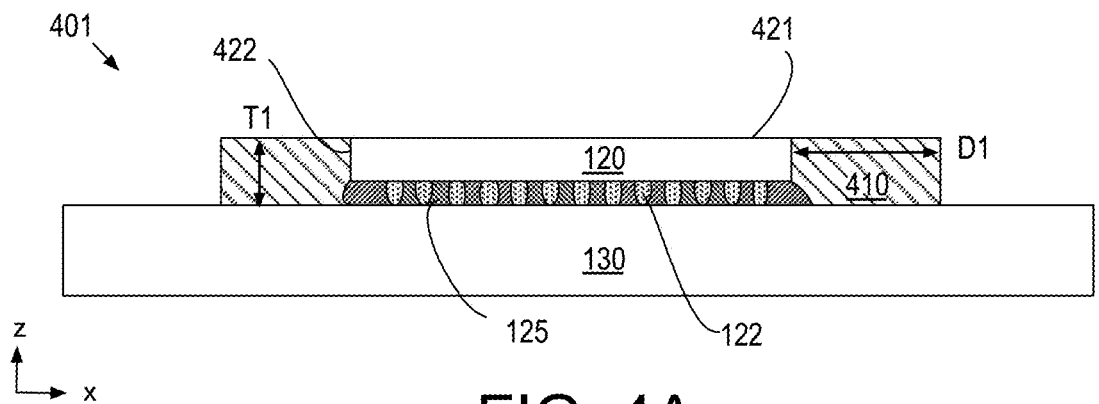
FIGS. 4A and 4B illustrate cross-sectional views of an IC die package evolving as the methods illustrated in FIG. 3 are practiced, in accordance with some embodiments.
Figure 4B:
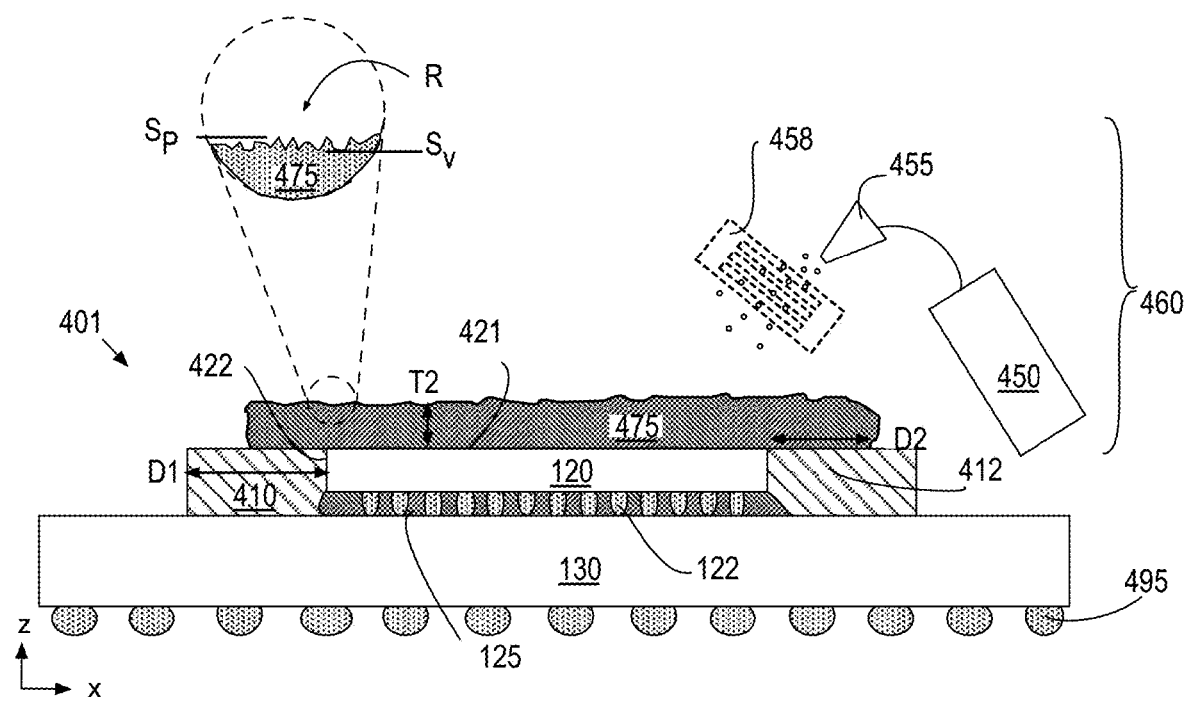

FIG. 3 is a flow diagram of methods 301 for forming a contiguous heat spreader over an IC die-package substrate assembly, in accordance with some embodiments of methods 201. Methods 301 further illustrate a specific implementation of methods 201. FIG. 4A-4B illustrate cross-sectional views of an IC die package evolving as the methods 301 are practiced, in accordance with some specific embodiments.

Referring first to FIG. 3, methods 301 may be performed by a microelectronics assembler responsible for first-level assembly of an IC die package, for example. Methods 301 begin with receiving one or more types of IC dies at block 310. The IC die may have any type of circuitry with any function, such as, but not limited to, power management ICs (PMICs), radio frequency communication ICs (RFICs), microprocessors (e.g., application processors, central processors, graphics processors), memory ICs (e.g., DRAM), or System on a Chip (SoC) ICs that may include two or more of these types of ICs, etc. The IC die received may have any footprint area, for example from a few $mm^2$, to around 1000 $mm^2$, or more. The IC die received may also have any thickness, for example from a few tens of microns (μm) to 800 μm, or more.

Methods 301 continue at block 320 where the IC die(s) received at block 310 are assembled upon a package substrate according to any first-level assembly techniques as embodiments herein are not limited in this respect. The package substrate may be any homogenous material or laminate of materials known to be compatible with first level assembly and compatible with the particular IC die(s) being assembled. In some exemplary embodiments, the assembly performed at block 320 employs flip-chip or an alternative chip-scale package (CSP) technology. Upon completing block 320, a plurality of first-level interconnects electrically couple the IC die(s) to metallization of the package substrate.

At block 330, a frame material is formed around a perimeter of the IC die(s). The frame material is therefore over a portion of the package substrate surrounding the IC die(s). The frame material formed at block 330 is to provide a mechanical support beyond an edge of the IC die(s), upon which a portion of heat spreader material may be deposited. The frame material may be formed through either discrete component (preform) assembly techniques or through the build-up of contiguous package material. For example, in some embodiments, a frame preform may be pick-and-placed to surround the IC die(s), and may be adhered to the substrate with an adhesive as one might apply a gasket. For such embodiments, there may be a gap between an edge sidewall and the frame preform (e.g., where only an underfill or epoxy adhesive is present) as a result of the frame preform being slightly over-sized to facilitate the assembly. In other embodiments, the frame material is built-up directly on the package, for example with a molding process, a dry film transfer (lamination) process, or with an HTAM process compatible with the package substrate. For any of these embodiments, the frame material may be contiguous with an edge sidewall of the IC die(s).

FIG. 4A illustrates one example where an exposed die mold (EDM) package 401 has been formed at block 330 of methods 301 (FIG. 3). In FIG. 4A, a frame material 410 has been formed over an exposed back-side surface 421 of IC die 120. Back-side surface 421 is opposite a front-side surface of IC die 120 that is interconnected to package substrate 130 by FLI 122 (e.g., solder bumps). FLI 122 are embedded within underfill material 125. IC die surface 421 may comprise an IC die substrate material, such as a semiconductor material that active devices (e.g., transistors) of the IC utilize. Alternatively, IC die surface 421 may be a material layer that has been deposited over an IC die substrate material (e.g., semiconductor material) during the fabrication of the IC die. Examples of such a material layer include, but are not limited to, metallization thin films (e.g., Ti, Cu, Ag, Au, Sn, In, Ni, etc.) or dielectric thin films (e.g., C, SiC, SiN, SiO, etc.). Such thin films may have a thickness below a few tens of microns, for example.

Following an overmold process, frame material 410 is in contact with an edge sidewall 422 of IC die 120, and has some thickness T1 over package substrate 130 extending a lateral distance D1 beyond edge sidewall 422. Frame material 410 may have any composition that is compatible with the IC die package and with heat spreader material that will be deposited over the frame material. In some embodiments, frame material 410 is optimized mechanically to minimize IC die warpage and/or interfacial stresses between IC die 120 and the heat spreader material that will be subsequently deposited, for example to avoid cracking and/or delamination of the heat spreader material. Frame material 410 may have a composition selected for a good CTE match with IC die 120 and/or package substrate 130. Frame material 410 may also have a relatively low bulk modulus, but should be sufficiently tough that it can be exposed to the HTAM process subsequently employed to deposit heat spreader material. Where the composition is also to be compatible with an overmolding process, frame material 410 may be an epoxy resin, for example. Epoxy resins can be readily molded and have good mechanical properties after cure.

In other embodiments, frame material 410 may be silicone-based. Epoxies and/or silicone embodiments may include filler particles (e.g., $SiO_2$, $Al_2O_3$, metal fillers, etc.), or not. In some embodiments, frame material 410 may comprise one or more metals (e.g., Cu, Al, Ag, Au, Sn, In, etc.), either as fillers, or as the predominant constituent of frame material 410. Frame material 410 may also comprise inorganic materials, such as crystalline carbon (e.g., diamond, graphite) or AN. In some embodiments, frame material 410 comprises a combination of different materials that are either co-deposited as a mixture or sequentially deposited as distinct layers of frame material 410.

Frame material 410 may have any thickness T1 (e.g., less than, equal to, or greater than that of the IC dies 120). In the example illustrated, thickness T1 is approximately equal to the thickness of IC die 120 and the z-height associated with FLI 122. Thickness T1 is approximately constant over distance D1. Distance D1 may vary with implementation, for example according to constraints on the footprint of package substrate 130.

Returning to FIG. 3, methods 301 continue at block 340 where heat spreader material is spray-deposited over the IC die(s) and over at least a portion of the frame material. Spray deposition is an HTAM process, which may be controlled to deposit heat spreader material over only portions of the IC die package (e.g., where either the IC die(s) or frame material is located). Heat spreader material need not be deposited on any regions of the IC die package not compatible with the HTAM process. For example, the HTAM process may be confined to within a footprint of the frame material formed at block 330 if a package substrate material might be damaged by particle impact associated with the HTAM process.

In the example shown in FIG. 4B, an HTAM process 460 forms heat spreader material 475. HTAM process 460 propels one or more source materials 450, in the form of a dry powder, through a dispense jet, or nozzle, 455. During the deposition process, dispense nozzle 455 may be displaced relative to EDM package 401 along a predetermined deposition path to cover some portion (or all of) IC die surface 421 as well as a distance D2 beyond IC die sidewall 422. Distance D2 may be a few millimeters to tens of millimeters, for example. Although distance D2 may vary, in some examples D2 is less than distance D1 occupied by frame material 410. Such an offset between D1 and D2 may be important where distance D1 is insufficient to cover an entirety of package substrate 130. Limiting distance D2 to be less than distance D1 may ensure no sensitive portion of package substrate 130 is exposed to HTAM deposition 460, for example.

Heat spreader material 475 is formed from jet-borne particles that have impacted together to build up a solid upon IC die surface 421, as well as upon a surface 412 on frame material 410. Heat spreader material 475 is therefore in direct contact with, or contiguous with, IC die surface 421 and frame surface 412. For embodiments where frame material 410 is in contact with substantially all of IC die sidewall 422, there is no heat spreader material 475 in contact with IC die sidewall 422. For alternative embodiments, where frame material 410 is in contact with only a partial height of IC die sidewall 422, heat spreader material 475 may be in contact with a portion of IC die sidewall 422 that is not embedded within frame material 410.

During HTAM process 460, the jet gas may be heated, for example to temperatures below the melting temperature of the particles. However, for cold spray examples there may be no separate external heating of source material 450 and/or EDM package 401 beyond the heating of the jet gas. Instead, energy is applied through particle momentum transfer. Source materials 450 may comprise a single material or blends of two or more materials. Malleable and/or ductile particles, such as metallic powders, may be entrained in a high-velocity gas jet and bond to each other and/or the underlying substrate (e.g. die surface 421) upon impact. As described in greater detail below, malleable particles may deform upon impact into flattened particles ranging in size from 5 microns to 200 microns that may build upon each other. As further illustrated in FIG. 4B, HTAM process 460 may optionally include the use of a deposition stencil 458 to confine the deposition of heat spreader material 475 to feature dimensions smaller than a width of the spray nozzle orifice. Deposition stencil 458 is illustrated in dashed line to emphasize its use is optional, for example where heat spreader material 475 is to be deposited with a minimum feature width of 100 μm, or less.

Heat spreader material 475 may have any thickness T2, as measured in a direction substantially orthogonal to a plane of IC die surface 421. In advantageous embodiments, thickness T2 is at least 100 μm. In some exemplary embodiments, thickness T2 is 100-2000 μm. In the illustrated example, thickness T2 is substantially constant over the area of heat spreader material 475, but as described further below, thickness T2 may also be varied between different regions of a contiguous heat spreader.

As further illustrated in the expanded view of FIG. 4B, heat spreader material 475 has a surface roughness R significantly greater than that of the underlying IC die surface 421 and/or frame material surface 412. IC die surface 421 may be specular (e.g., a polished semiconductor material) or may be a non-specular surface having a roughness similar to that of frame material surface 412 (e.g., <1-10 μm RMS). Heat spreader material 475 may have an RMS roughness of at least 10 μm. For the cross-section illustrated in FIG. 4B, surface roughness R may also be characterized as a roughness profile with peaks and valleys varying between a minimum surface profile valley $S_v$ and a maximum surface profile peak $S_p$ that differ by at least 10 μm in the vertical direction (e.g., z-dimension).

The composition and/or microstructure and/or surface morphology of heat spreader material 475 may be selected to achieve a high thermal conductivity. In some embodiments, heat spreader material 475 has an effective thermal conductivity that exceeds that of the IC die 120. The effective thermal conductivity of heat spreader material 475 may also exceed that of frame material 410. In some embodiments, heat spreader material 475 has an effective thermal conductivity coefficient over 200 $Wm^{-1}K^{-1}$, and may be in the range of 200-2000 $Wm^{-1}K^{-1}$, at least within the X-Y plane (e.g., parallel to the plane of IC die 120). Heat spreader material 475 may also have a relatively high bulk modulus (e.g., greater than that of frame material 410). The higher bulk modulus may advantageously provide mechanical stiffening to EDM package 401 and/or provide physical protection to the underlying IC die 120. In some examples, heat spreader material 475 has a bulk modulus over 100 MPa and/or a hardness over 100 on the Shore A scale.

Heat spreader material 475 may have a substantially homogenous composition, for example where HTAM deposition 460 employs only one source material 450. Alternatively, heat spreader material 475 may be a composite of a plurality of material particles having different compositions, for example where HTAM deposition 460 employs multiple source materials 450. Heat spreader material 475 may also have a layered structure, for example where different source materials 450 are switched during a sequential HTAM deposition process.

Figure 5:
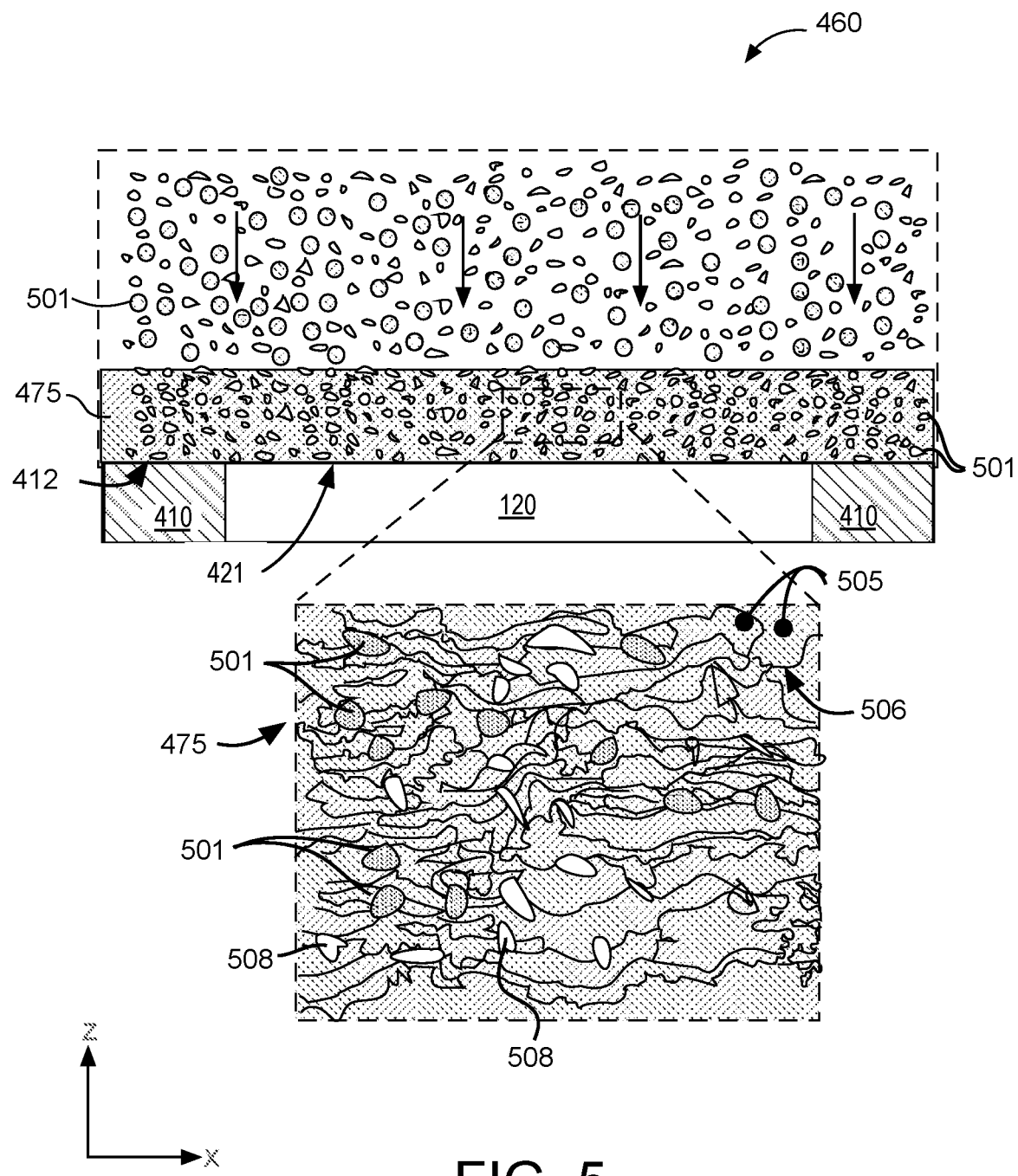
FIG. 5 illustrates the formation of a contiguous heat spreader with a high throughput additive manufacturing (HTAM) technique, in accordance with some embodiments.

FIG. 5 further illustrates deposition of particles 501 to form heat spreader material 475 upon IC die surface 421 and frame material surface 412, in accordance with some embodiments of HTAM process 460. As shown, the microstructure of heat spreader material 475 comprises embedded particles 501 and voids 508. At sufficient magnification, boundaries between particles 501 are apparent as distinguished from atomic deposition processes, such as plating. Lamellar structures may be evident within heat spreader material 475, which are indicative of impact between particles and a substrate surface, where most of the particles plastically deform and flatten or otherwise splat. Particles may impact each other in succession, forming stacks of contiguous irregular or regular-shaped lamellae 505. In some embodiments, individual lamellae 505 are delineated by discernable boundaries 506, which may be observed at magnifications below 500×. In other embodiments, lamellae 505 may not be apparent at even higher magnifications.

Because particles 501 may have irregular shapes, voids 508 can appear at boundaries 506 between embedded particles 501. As such, the porosity of heat spreader material 475 may be higher than the material of IC die 120. For embodiments where frame material 410 was not also formed by an HTAM process, the porosity of heat spreader material 475 may also be higher than frame material 410. Porosity may be expressed as % voiding area (as measured from a cross sectional micrograph within the x-y plane illustrated in FIG. 5). The microstructure of materials formed by cold spray, thermal spray, or a similar HTAM process, may have larger void area percentages than materials having substantially the same composition formed by other techniques. Voiding area percentage is a quality control parameter that can be monitored in spray deposition processes. While bulk material, and thin film materials deposited by other means (e.g., atomic techniques), typically have void areas of zero, materials deposited by HTAM processes (e.g., cold spray) may have void areas ranging from 0.1% to 0.5%, or more. Hence, the existence of voids 508 is indicative of heat spreader material 475 having been formed by an HTAM process, such as spray deposition (e.g., a cold spray process). The presence of similar voiding within frame material 410 would likewise be indicative of frame material 410 having been formed by an HTAM process.

In some exemplary embodiments, particles 501 comprise a metal, such as one or more of, indium, bismuth, tin, gallium, copper, iron, nickel, manganese, molybdenum, chromium, silver, gold, titanium, aluminum, tungsten, or platinum. Particles of metal may be crystalline, with crystal orientations of particles 501 being random so that heat spreader material 475 lacks significant crystal texture. In some other exemplary embodiments, particles 501 comprise a non-metal, such as one or more of, silicon, carbon, nitrogen or oxygen. Such non-metal particles may also be crystalline, for example with crystalline carbon present as diamond particles, or graphite particles. In some embodiments, particles 501 are compounds, such as AlN particles, SiC particles, $Al_2O_3$ particles, etc.

In still other embodiments, metal particles (e.g., one or more of In, Bi, Sn, Ga, Cu, Fe, Ni, Mn, Mo, Cr, Ag, Au, Ti, Al, W, or Pt) may be intermixed with non-metal particles (e.g., one or more of C, Si, O, or N). Heat spreader material 475 may therefore comprise a blend of metal and non-metal materials. Particles of the non-metal, (e.g., diamond or graphite, metal nitrides, metal oxides etc.) may be embedded in a matrix of the malleable and/or ductile metal particles. For some such embodiments, heat spreader material 475 has a higher atomic % of metal (or a lower atomic % of non-metals) than frame material 410. Particles 501 may also have a composition that varies as a function of thickness T2, for example, in either layered or gradient structures. Particles 501 proximal to IC die surface 421 may therefore have a first composition while particles 501 distal from IC die surface 421 may have a second composition.

Returning to FIG. 3, methods 301 are completed at output 350, where the resulting IC die package including the contiguous heat spreader may be provided, either as a saleable product (e.g., offered by a component supplier in microelectronics assembly supply chain) or as an internal precursor, where second-level interconnects 495 (FIG. 4B) are assembled upon a system-level host (not depicted).

Figure 6A:
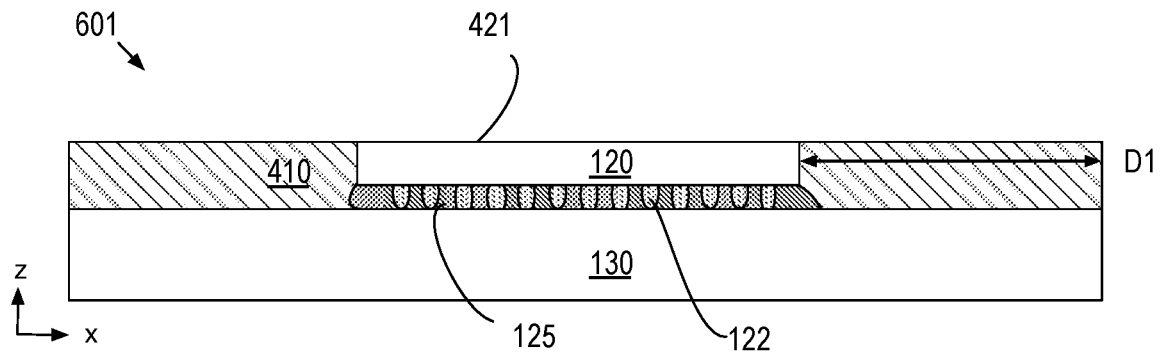
FIGS. 6A, 6B, 6C, and 6D illustrate cross-sectional views of an IC die package evolving as the methods illustrated in FIG. 3 are practiced, in accordance with some alternative embodiments.
Figure 6B:
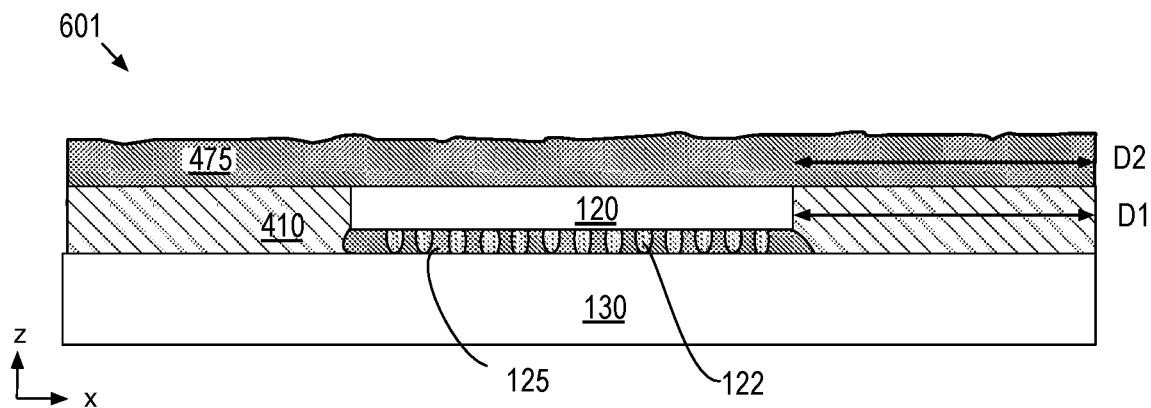

FIG. 6A-6D illustrate cross-sectional views of an IC die package 601 evolving as methods 301 are practiced, in accordance with some alternative embodiments. Reference labels of features introduced in FIG. 4A-4B are retained in FIG. 6A-6D where those features may have any of the same attributes described above. As shown in FIG. 6A, frame material 410 covers the entirety of package substrate 130. An HTAM process may therefore deposit heat spreader material 475 over IC die surface 421 and over an entirety of frame material 410, as shown in FIG. 6B. For such embodiments, rather than positioning a spray jet successively over individual IC die packages, heat spreader material 475 may be spray deposited concurrently over a large area that spans a plurality of IC die packages 601 (e.g., over the entirety of a panel of reconstituted IC die packages).

Figure 6C:
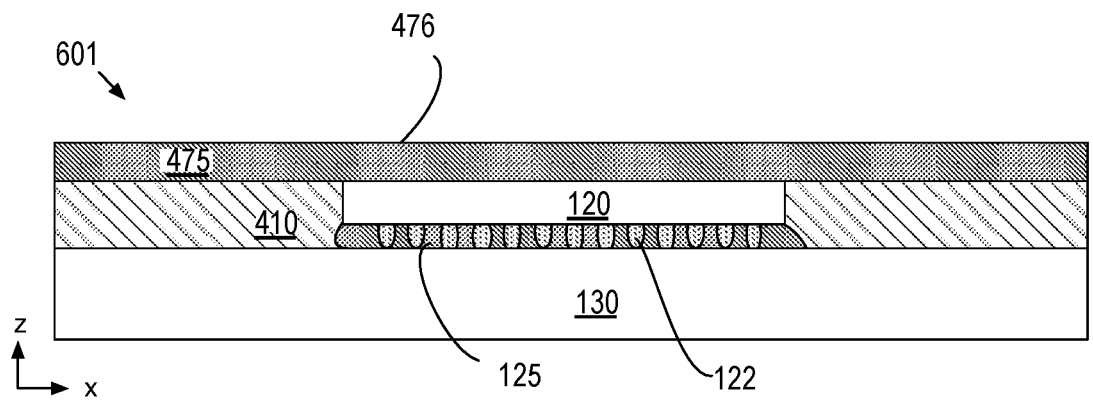
Figure 6D:
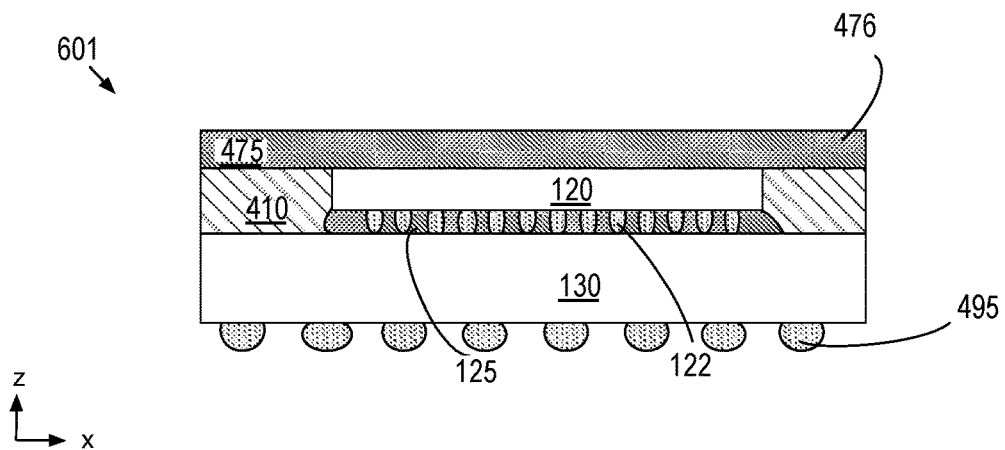

As further depicted in FIG. 6C, heat spreader material 475 may be lapped and/or polished down so that a top surface 476 is substantially planar over the entire area of IC die package 601. For such embodiments, heat spreader material top surface 476 may have an RMS surface roughness value well below 10 μm, and potentially less than 1 μm. IC die packages may then be singulated from a panel, for example with any known laser-based or mechanical process to arrive at an IC die package 601 substantially as illustrated in FIG. 6D. As shown, an entirety of package substrate 130 is covered with frame material 410, and an entirety of frame material 410 is covered with heat spreader material 475. In this example, distance D2 is substantially equal to distance D1, with only a sidewall of frame material 410 being free of heat spreader material 475.

Figure 7A:
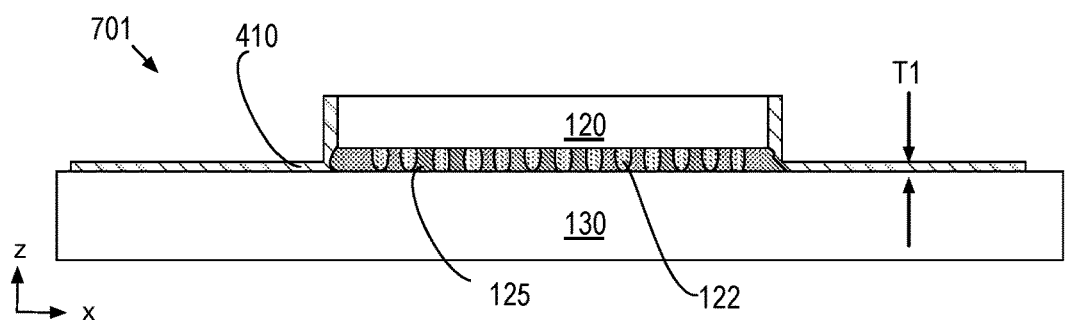
FIGS. 7A and 7B illustrate cross-sectional views of an IC die package evolving as the methods illustrated in FIG. 3 are practiced, in accordance with some alternative embodiments.
Figure 7B:
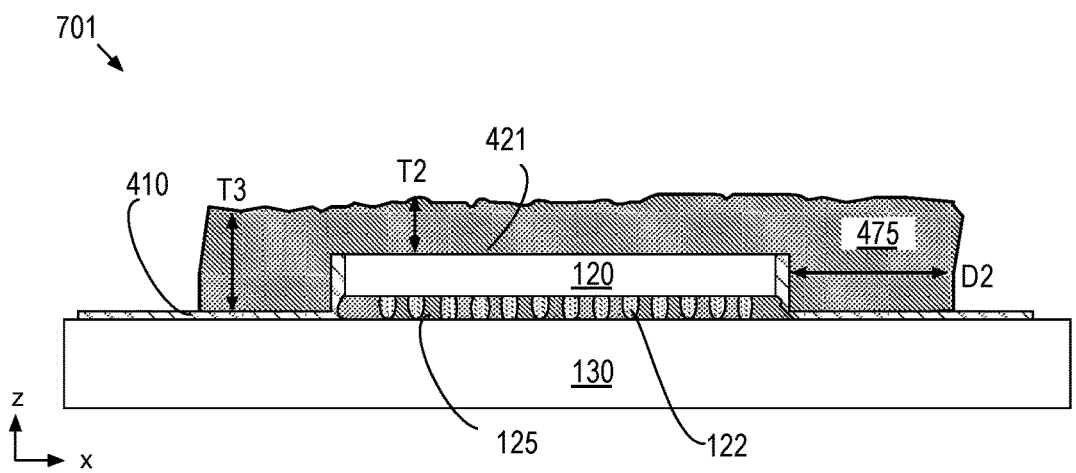

As noted above, frame material 410 may be formed by film transfer, or may also be formed by HTAM. Film transfer or HTAM techniques may also form frame material to any thickness around a perimeter of one or more IC dies. FIGS. 7A and 7B illustrate cross-sectional views of an IC die package 701 evolving as methods 301 are practiced, in accordance with some alternative embodiments where a frame material of minimal thickness is conformally deposited. Reference labels of features introduced in FIG. 4A-4B are retained in FIG. 7A-7B where those features may have any of the same attributes described above.

As shown in FIG. 7A, frame material 410 has been deposited in a substantially conformal manner to further illustrate how frame material thickness T1 may be much less than the z-height of IC die 120. In this example, frame material 410 may have been laminated upon IC die package 701, or may have been selectively deposited around the IC die perimeter by an HTAM process. As further illustrated in FIG. 7B, heat spreader material 475 is then deposited (e.g., by the HTAM process 460 described above) to thickness T2 over IC die surface 421, and to a greater thickness T3 over frame material 410. The target difference in heat spreader material thickness (T3−T2) may be predetermined to substantially accommodate the difference in z-height between IC die 120 and frame material 410 so as to arrive at a substantially planar heat spreader surface 476 that is suitable for making good thermal contact with a system-level thermal solution. To achieve the different thicknesses T2 and T3, an HTAM spray nozzle may be first scanned around the perimeter of IC die 120, depositing heat spreader material over frame material 410 until reaching a thickness comparable to the z-height of IC die 120. The HTAM spray nozzle may then be further scanned over IC die 120 (and over the heat spreader material over frame material 410) until heat spreader material thicknesses T2 and T3 are achieved in the respective regions.

For embodiments where there is no compositional distinction between frame material and heat spreader material, and both are deposited by HTAM so there is also no microstructural distinctions, the contiguous heat spreader structure will be similar to that illustrated in FIG. 7B, but with heat spreader material in direct contact with a surface of package substrate 130. For such embodiments, heat spreader material may be similarly deposited to different thicknesses T3 and T2 over package substrate 130 and IC die 120, respectively.

The ability to control the thickness of heat spreader material within the footprint of an IC die package may also be leveraged to accommodate differences in z-height between multiple IC die of a multi-chip package (MCP). Despite covering IC die of different z-heights, the heat spreader surface may be substantially planar and make good thermal contact with a system-level thermal solution spanning the area of the multiple IC die. The ability to form a material of high thermal conductivity contiguously with IC dies of differing z-heights, and to accommodate that die height mismatch, can significantly improve thermal performance of a multi-chip package relative to approaches that might instead rely on TIM layers of different thickness.

Figure 8A:
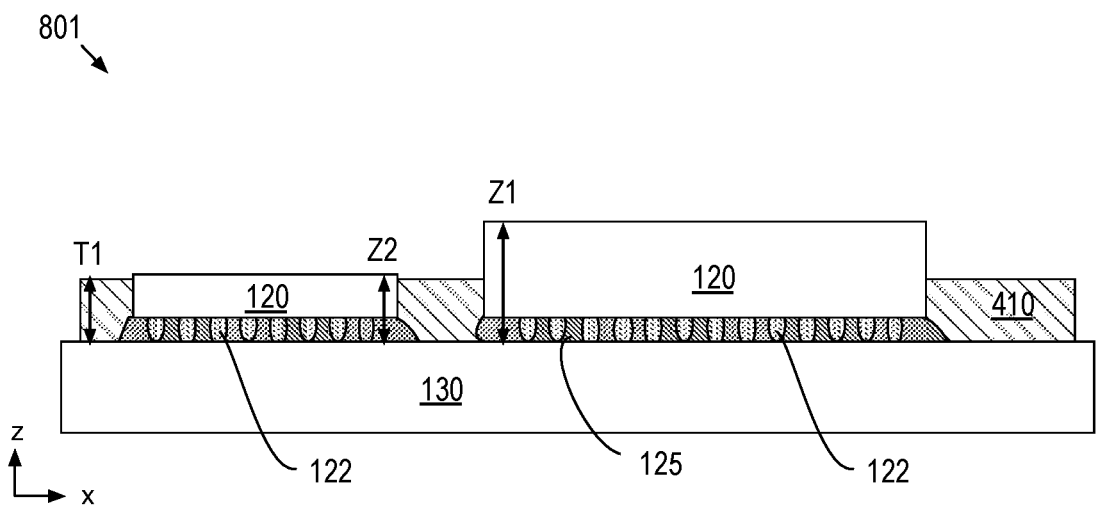
FIGS. 8A and 8B illustrate cross-sectional views of a multi-IC die package evolving as the methods illustrated in FIG. 3 are practiced, in accordance with some multi-chip embodiments.
Figure 8B:
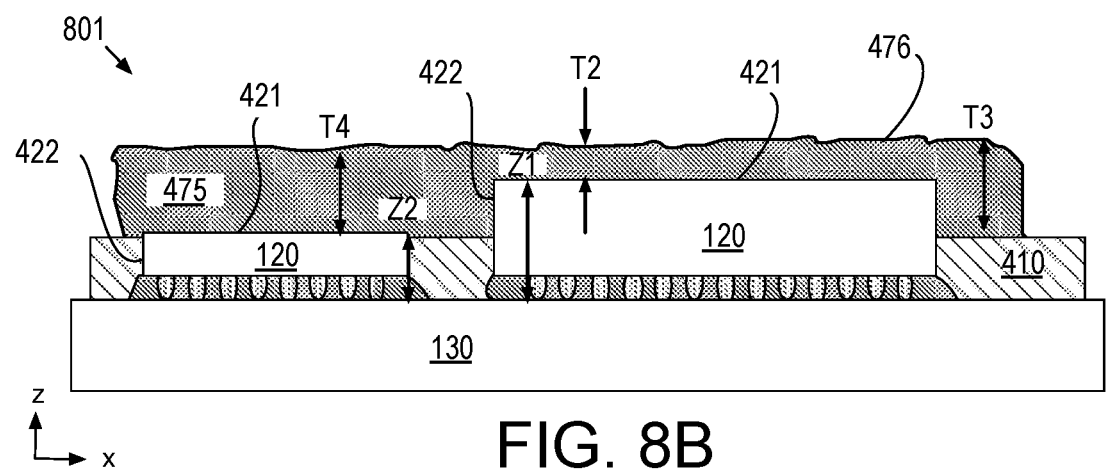

FIGS. 8A and 8B illustrate cross-sectional views of a multi-IC die package 801 evolving as methods 301 are practiced, in accordance with some MCP embodiments. Reference labels of features introduced in FIG. 4A-4B are retained in FIG. 8A-8B where those features may have any of the same attributes described above. As shown in FIG. 8A, multi-IC die package 801 includes a first IC die 120 of a lesser chip z-height Z2 over a first region of package substrate 130. Multi-IC die package 801 further includes a second IC die 120 of a greater chip z-height Z1 over another region of package substrate 130. In this example, frame material 410 surrounds both IC dies 120, and has some thickness T1 over still another region of package substrate 130.

FIG. 8B illustrates multi-IC die package 801 following deposition of heat spreader material 475 (e.g., by HTAM process 460). Heat spreader material 475 is contiguous with IC die surfaces 421 of both adjacent IC die 120. For IC die 120 of lesser chip z-height Z2, heat spreader material 475 is only on IC die surface 421. For IC die 120 of greater chip z-height Z1, heat spreader material 475 is also on a portion of IC die sidewall 422. As shown, heat spreader material 475 has a thickness T2 over IC die 120 of greater chip z-height Z1, a thickness T3 over frame material 410, and a thickness T4 over IC die 120 of lesser chip z-height Z2. While thicknesses T2, T3 and T4 may vary independently, in the illustrated example thicknesses T2, T3 and T4 accommodate the differences between chip z-heights Z1, Z2 and frame thickness T1 so that heat spreader surface 476 is substantially planar over the entire footprint of heat spreader material 475.

In many multi-chip packages, thermal cross-talk (i.e., the transfer of heat from one IC die to another) may be detrimental to package performance. For example, some IC dies, such as memory IC dies, cannot withstand as high of temperatures as logic IC dies. Thus, thermal cross-talk from a logic IC, such as a microprocessor, to a memory die through a heat spreader material may degrade the memory IC die performance. In some multi-chip package embodiments, the thickness of heat spreader material therefore varies between adjacent IC die to reduce thermal bridging/ increase thermal isolation. The ability to control 3D topography within the area of a heat spreader material enables HTAM to create an air gap anywhere within the area of an otherwise contiguous heat spreader, for example between IC dies with a lower temperature limit and high power dies within the package. Such a gap can shield an IC die having a lower temperature limit from heat dissipating through the heat spreader from a higher power IC die.

Figure 9A:
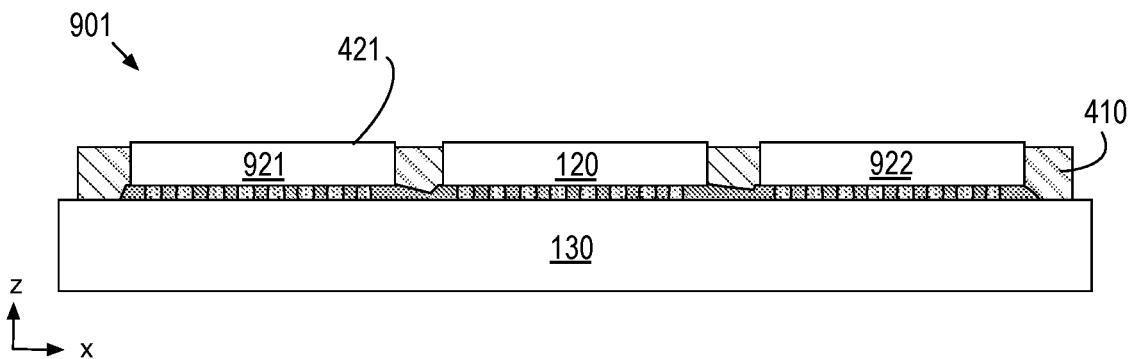
FIGS. 9A and 9B illustrate cross-sectional views of a multi-IC die package evolving as the methods illustrated in FIG. 3 are practiced, in accordance with some multi-chip embodiments.
Figure 9B:
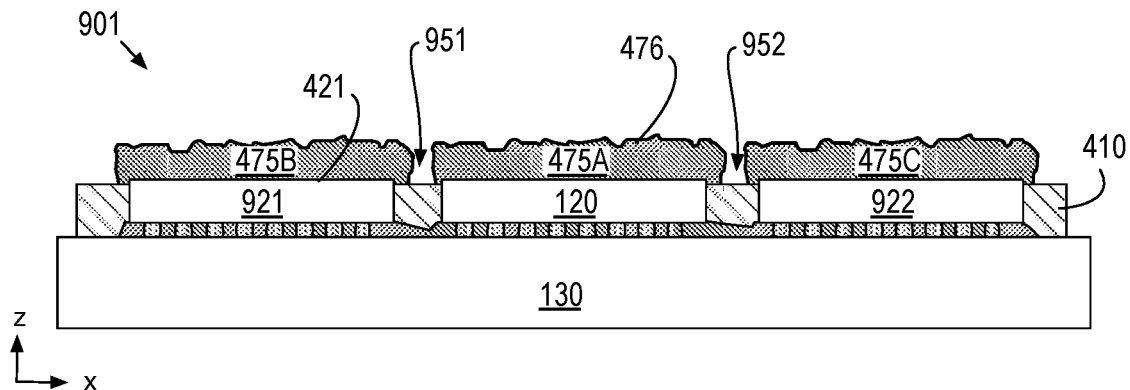
Figure 9C:
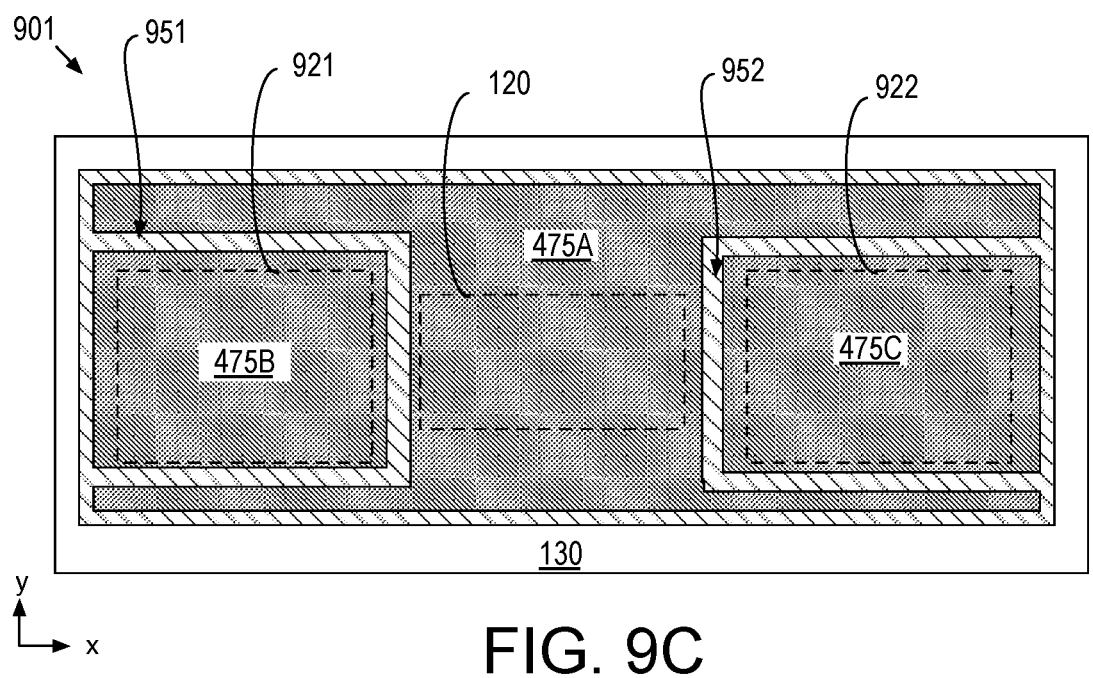
FIG. 9C illustrates a plan view of the multi-IC die package illustrated in FIG. 9B, in accordance with some embodiments.

FIGS. 9A and 9B illustrate cross-sectional views of a multi-chip package 901 evolving as methods 301 are practiced, in accordance with some MCP embodiments. Reference labels of features introduced in FIG. 4A-4B are retained in FIG. 9A-9B where those features may have any of the same attributes described above. In this example, IC die 120, during operation, will dissipate more power than two adjacent IC dies 921, 922. In one example IC die 120 is a microprocessor IC die while IC dies 921, 922 are memory IC dies. Heat generated by IC die 120 will laterally spread into the areas occupied by IC dies 921 and 922 as a function of thermal resistance between these areas. In some embodiments where IC dies 921, 922 are thermally sensitive, heat spreader material is separately deposited over the individual IC dies 120, 921 and 922, for example as shown in FIG. 9B. A thermal break 951 where minimal heat spreader material is deposited may laterally separate heat spreader material portion 475A that is contiguous with IC die 120 from heat spreader material portion 475B that is contiguous with IC die 921. Another thermal break 952 may laterally separate heat spreader material portion 475C that is contiguous with IC die 922 from heat spreader material portion 475A. In this example, heat spreader material is substantially absent within thermal breaks 951 and 952. However, thermal breaks 951, 952 may instead comprise a non-zero thickness of heat spreader material that is significantly thinner than heat spreader material portions 475A, 475B, 475C. As shown in the plan view of FIG. 9C, thermal break 951 may form a perimeter moat of high thermal resistance around heat spreader material portion 475B. Thermal break 952 may similarly form a perimeter moat of high thermal resistance around heat spreader material portion 475C. For such embodiments, frame material 410 may also be optimized for thermal properties (e.g., being a low thermal conductivity material) that further minimizes thermal cross-talk between die through frame material 410.

Figure 10A:
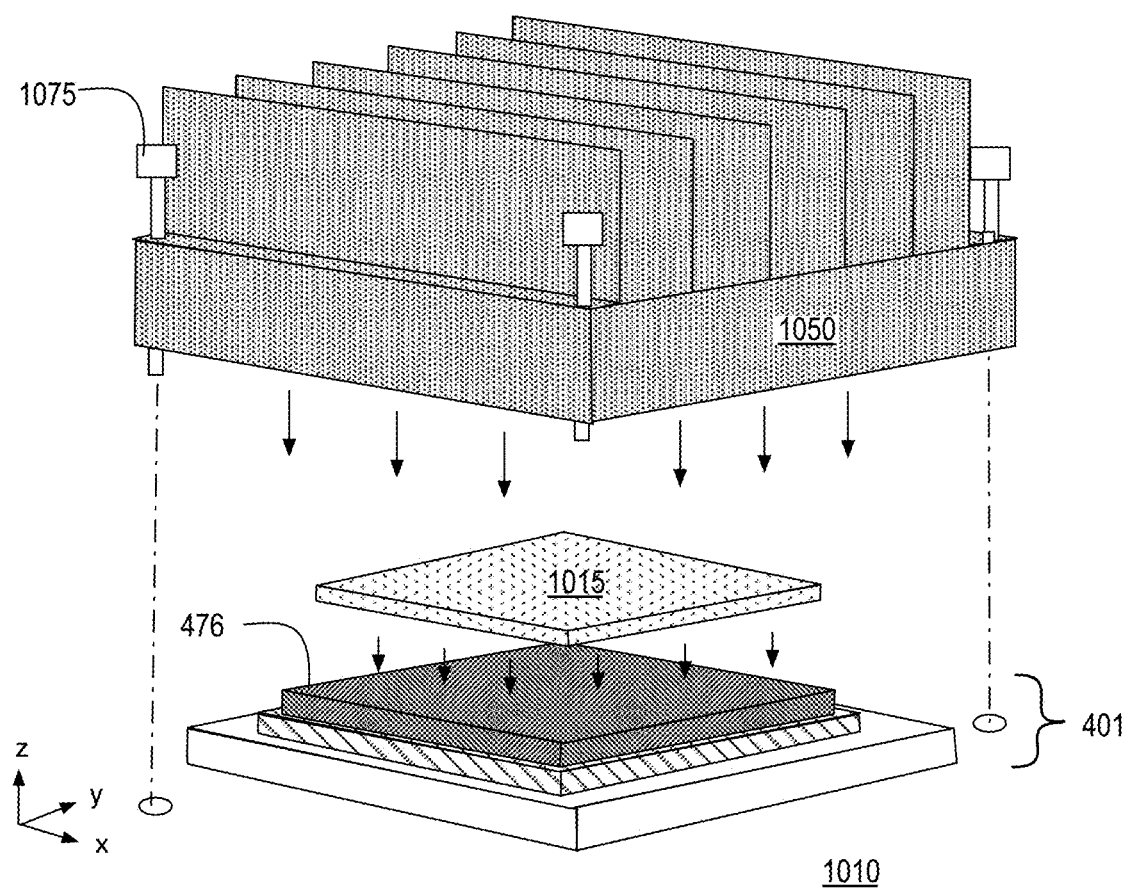
FIG. 10A is an isometric view illustrating a heat sink being assembled over an IC die package including a contiguous heat spreader, in accordance with some embodiments.
Figure 10B:
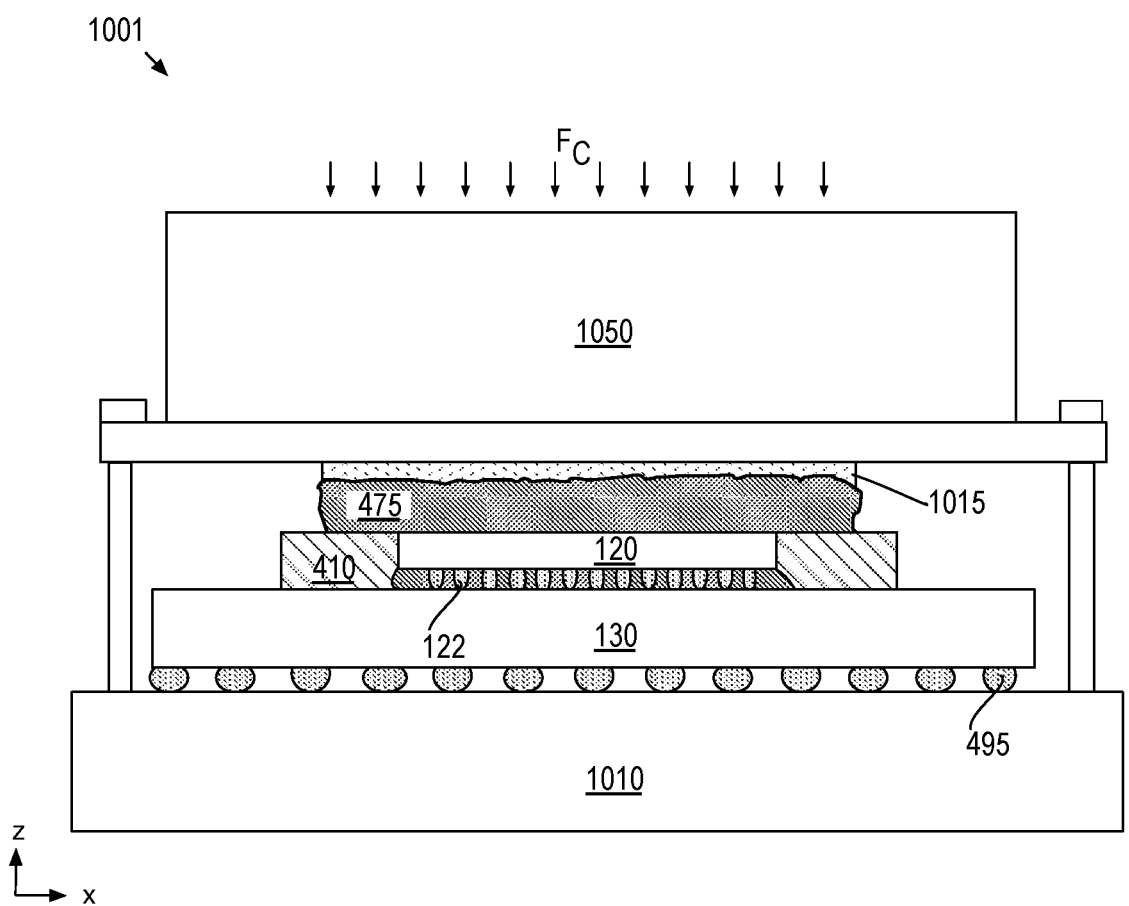
FIG. 10B is a cross-sectional view of the system-level assembly illustrated in FIG. 10A, in accordance with some embodiments.

In some embodiments, a microelectronic system platform includes a contiguously integrated heat spreader, for example having one or more of the attributes described above. FIG. 10A illustrates an exploded isometric view of a system-level thermal solution being assembled over IC die package 401 that includes a contiguous heat spreader, in accordance with some embodiments. As shown, a TIM 1015 is applied to contact an exposed heat spreader surface 476. TIM 1015 may be any material suitable for interfacing a system thermal solution to an IC die package and/or to an integrated heat spreader. As further illustrated, a thermal solution 1050 is assembled so as to contact a side of TIM 1015 opposite IC die package 401. In the illustrated example, thermal solution 1050 is a heat sink, but it may instead comprise a microfluidic cooling device, a heat pipe, or any other thermal solution known to be suitable for a microelectronic system platform. As shown, IC die package 401 is interconnected to a system PCB 1010, for example through second level interconnects (not depicted). Thermal solution 1050 is assembled with mechanical couplers 1075 (e.g., screws, pins, etc.) that are aligned to mating receptacles in a PCB 1010. During system assembly, mechanical couplers 1075 are to apply a compressive force $F_c$ to TIM 1015, for example as further illustrated in FIG. 10B. Force $F_c$ (e.g., exerting pressure in the range of 1-1000 kPa) compresses TIM 1015 against heat spreader surface 476, ensuring good thermal contact.

Figure 11:
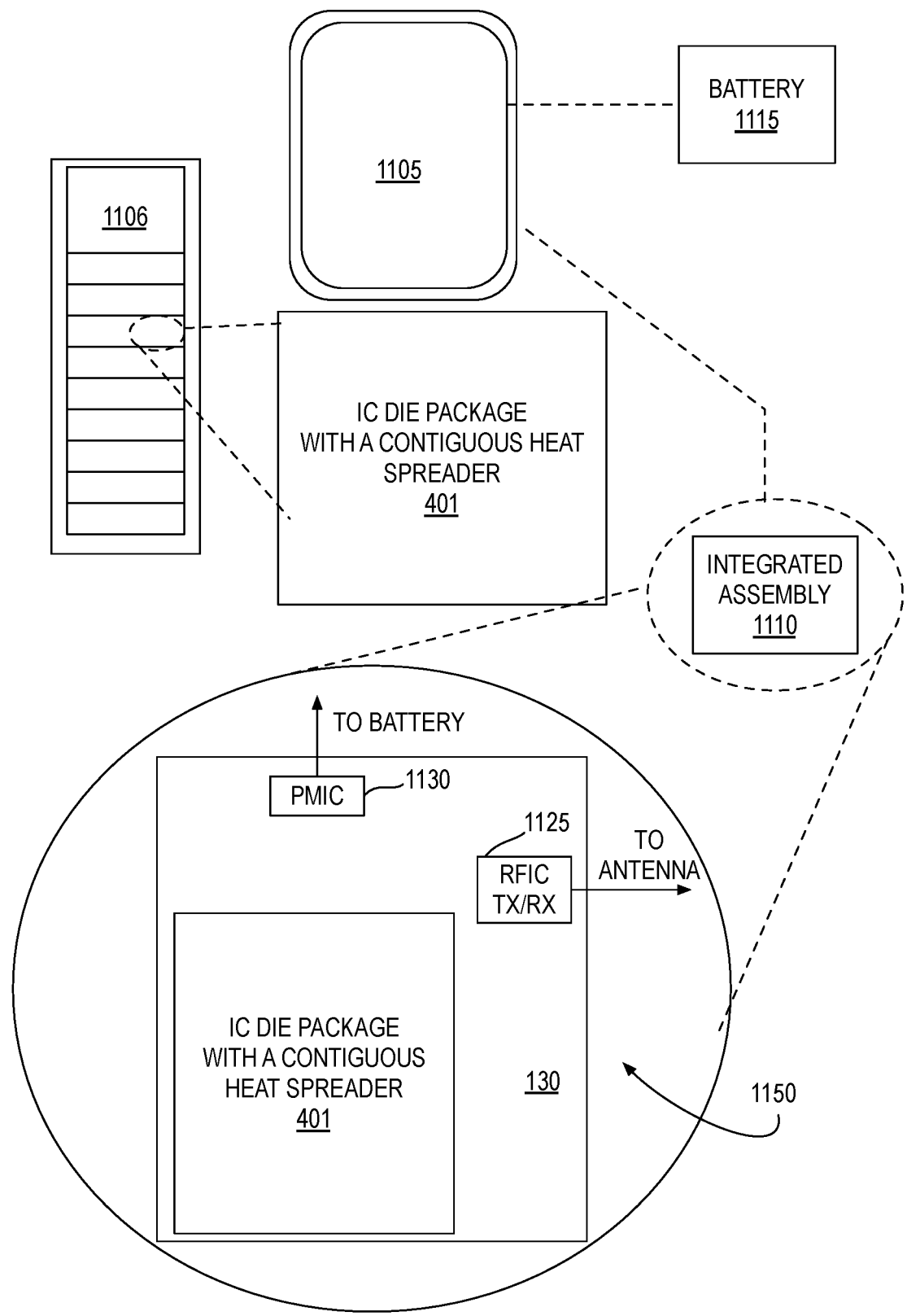
FIG. 11 illustrates a mobile computing platform and a data server machine employing an IC die package having a contiguous heat spreader, in accordance with some embodiments.

FIG. 11 illustrates a mobile computing platform and a data server computing platform, each employing an IC die package with a contiguous heat spreader. The server machine 1106 may be any commercial server, for example including any number of high-performance computing platforms disposed within a rack and networked together for electronic data processing, which in the exemplary embodiment includes IC die package 401, for example as described above. The mobile computing platform 1105 may be any portable device configured for each of electronic data display, electronic data processing, wireless electronic data transmission, or the like. For example, the mobile computing platform 1105 may be any of a tablet, a smart phone, laptop computer, etc., and may include a display screen (e.g., a capacitive, inductive, resistive, or optical touchscreen), a chip-level or package-level integrated assembly 1110, and a battery 1115.

IC die package 401 may include a memory IC and processor IC, and may further include a contiguous heat spreader, for example as described elsewhere herein. In the example shown in the expanded view 1150, package 401 is coupled to package substrate 130 that may further host one or more additional IC die packages, such as a power management integrated circuit (PMIC) package 1130, or RF (wireless) integrated circuit (RFIC) package 1125, for example. PMIC 1130 may perform battery power regulation, DC-to-DC conversion, etc., and so has an input coupled to battery 1115 and with an output providing a current supply to other functional modules. RFIC 1125 may have an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 12:
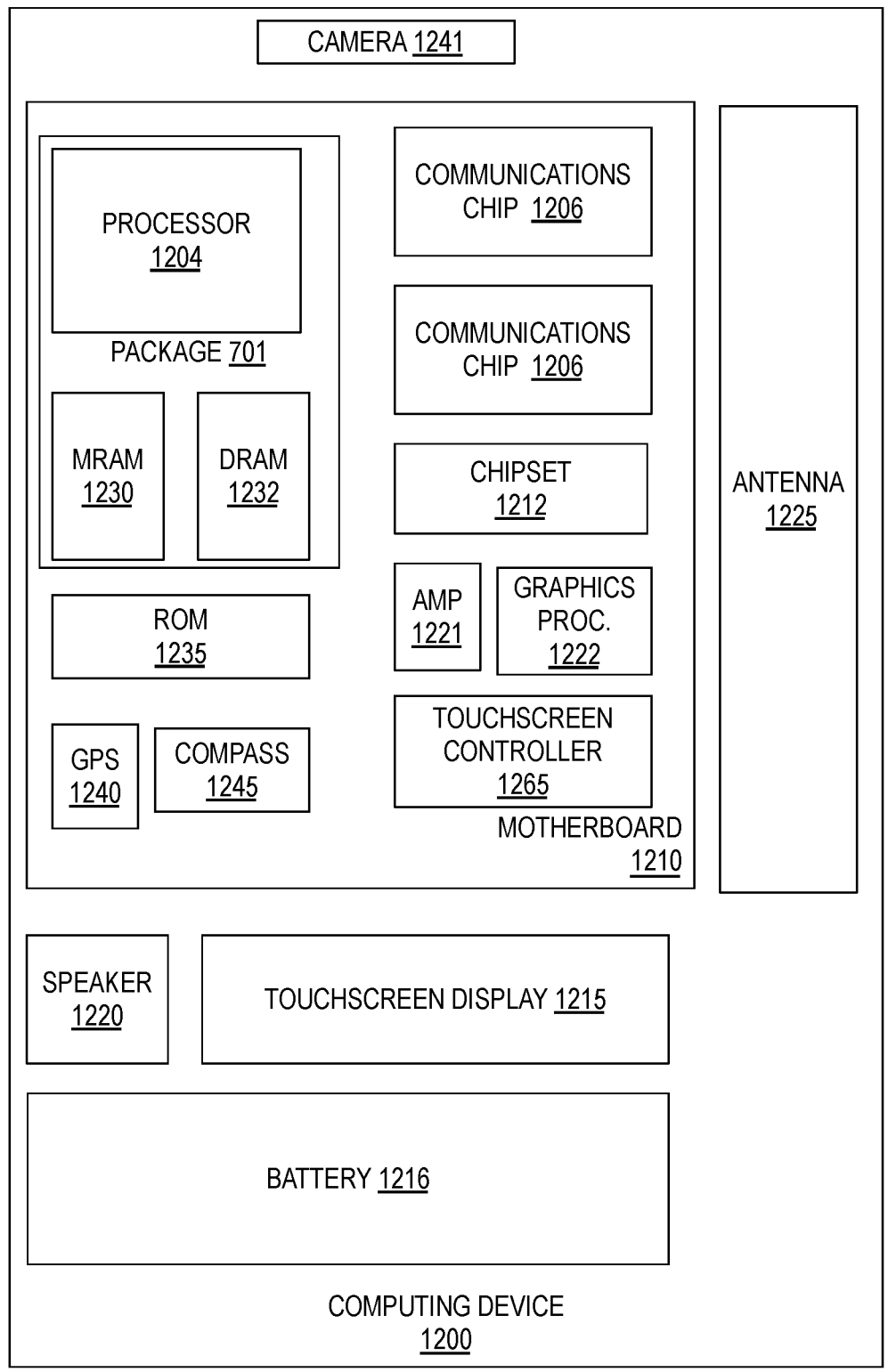
FIG. 12 is a functional block diagram of an electronic computing device, in accordance with some embodiments.

FIG. 12 is a functional block diagram of an electronic computing device 1200, in accordance with an embodiment of the present invention. Computing device 1200 may be found inside mobile platform 1105 or server platform 1106, for example. Device 1200 further includes a motherboard 1210 hosting a number of components, such as, but not limited to, a processor 1204 (e.g., an applications processor). Processor 1204 may be physically and/or electrically coupled to motherboard 1210. In some examples, processor 1204 is contiguously integrated with a heat spreader, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1206 may also be physically and/or electrically coupled to the motherboard 1210. In further implementations, communication chips 1206 may be part of processor 1204. Depending on its applications, computing device 1200 may include other components that may or may not be physically and electrically coupled to motherboard 1210. These other components include, but are not limited to, volatile memory (e.g., DRAM 1232), non-volatile memory (e.g., ROM 1235), flash memory (e.g., NAND or NOR), magnetic memory (MRAM 1230), a graphics processor 1222, a digital signal processor, a crypto processor, a chipset 1212, an antenna 1225, touchscreen display 1215, touchscreen controller 1265, battery 1216, audio codec, video codec, power amplifier 1221, global positioning system (GPS) device 1240, compass 1245, accelerometer, gyroscope, speaker 1220, camera 1241, and mass storage device (such as hard disk drive, solid-state drive (SSD), compact disk (CD), digital versatile disk (DVD), and so forth), or the like. In some exemplary embodiments, at least one of the functional blocks noted above comprise an IC package including a contiguous heat spreader, for example as described elsewhere herein.

Communication chips 1206 may enable wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1206 may implement any of a number of wireless standards or protocols, including but not limited to those described elsewhere herein. A first communication chip 1206 may be dedicated to shorter-range wireless communications, such as Wi-Fi and Bluetooth, and a second communication chip 1206 may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example, the above embodiments may include specific combinations of features as further provided below.

In first examples, an integrated circuit (IC) die package, comprises a package substrate, an IC die having a first surface coupled to a first region of the package substrate, and a heat spreader material contiguous with a second surface of the IC die, opposite the first surface. The heat spreader material extends beyond an edge of the IC die over a second region of the package substrate.

In second examples, for any of the first examples the IC die package further comprises a frame material around a perimeter of the IC die, the frame material between the heat spreader material and the second region of the package substrate. The frame material has a different composition than the heat spreader material.

In third examples, for any of the first through second examples the heat spreader material has a thickness of at least 100 μm.

In fourth examples, for any of the third examples the heat spreader material has a thermal conductivity of at least 200 $Wm^{-1}K^{-1}$.

In fifth examples, for any of the fourth examples the heat spreader material comprises at least one of a metal, silicon, or carbon.

In sixth examples, for any of the first through fifth examples the heat spreader material has a void area of at least 0.1%.

In seventh examples, for any of the first through sixth examples the heat spreader material has an RMS surface roughness below 10 μm.

In eighth examples, for any of the first through seventh examples the heat spreader material is substantially planar over both the first region and the second region of the package substrate.

In ninth examples, for any of the first through eighth examples the heat spreader material has a first thickness over the second surface of the IC die, a second thickness, greater than the first thickness, over the second region of the package substrate.

In tenth examples, for any of the first through ninth examples the IC die is a first IC die, the IC die package further comprises a second IC die over a third region of the package substrate, adjacent to the first region, and the heat spreader material is substantially planar over both the first region and the third region of the package substrate.

In eleventh examples, for any of the tenth examples the first IC die has a first height from the package substrate and the second IC die has a second height from the package substrate, different than the first height.

In twelfth examples, for any of the tenth through eleventh examples the IC die package further comprises a thermal break between a first portion of the heat spreader material that is over the first IC die, and a second portion of the heat spreader material that is over the second IC die.

In thirteenth examples, for any of the twelfth examples the thermal break comprises a discontinuity in the heat spreader material.

In fourteenth examples, a computer platform comprises a printed circuit board (PCB), and an integrated circuit (IC) die package interconnected to the PCB. The IC die package comprises a package substrate, an IC die having a first surface coupled to a first region of the package substrate, and a heat spreader material contiguous with a second surface of the IC die, opposite the first surface, wherein the heat spreader material extends beyond an edge of the IC die over a second region of the package substrate. The computer platform comprises a power supply coupled to provide power to the IC die package, a thermal interface material (TIM) in contact with a surface of the heat spreader material, opposite the IC die, and a heat exchanger in contact with the TIM.

In fifteenth examples, for any of the fourteenth examples the IC die is a first IC die and the IC die package further comprises a second IC die over a third region of the package substrate, laterally adjacent to the first region, and the heat spreader material is contiguous with a surface of the second IC die.

In sixteenth examples, for any of the fourteenth through fifteenth examples the heat spreader material comprises a first heat spreader material contiguous with the surface of the first IC die, and a second heat spreader material contiguous with the surface of the second IC die. A thermal break laterally separates the first and second heat spreader materials.

In seventeenth examples, a method of fabricating an IC die heat spreader comprises receiving an IC die over a first region of a package substrate, and spray depositing a material onto an exposed surface of the IC die, and over a second region of the package substrate beyond an edge sidewall of the IC die.

In eighteenth examples, for any of the seventeenth examples the spray depositing further comprises cold spraying a material having a thermal conductivity of at least 200 $Wm^{-1}K^{-1}$.

In nineteenth examples, for any of the seventeenth through eighteenth examples the method further comprises forming a frame material around a perimeter of the IC die and over the second region, and spray depositing the material onto the exposed surface of the IC die and onto a surface of the frame material.

In twentieth examples, for any of the nineteenth examples forming the frame material comprises at least one of overmolding the frame material or dry film transferring the frame material.

In twenty-first examples, for any of the seventeenth through twentieth examples the spraying depositing further comprises propelling one or more powders through a stencil.

In twenty-second examples, for any of the twenty-first examples the stencil prevents the material from depositing between the IC die and a second IC die coupled to a third region of the package substrate.

In twenty-third examples, for any of the seventeenth through twenty-second examples the spray depositing further comprises depositing a first thickness of the material over the IC die and depositing a second thickness of the material, greater than the first thickness of material, over the second region of the package substrate.

In twenty-fourth examples, for any of the seventeenth through twenty-third examples the method further comprises planarizing a top surface of the material.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) die package, comprising:
a package substrate;

an IC die having a first surface coupled to a first region of the package substrate; and a heat spreader material contiguous with a second surface of the IC die, opposite the first surface, wherein the heat spreader material extends beyond an edge of the IC die over a second region of the package substrate and wherein the heat spreader material is a solid with a void area percentage of at least 0.1%.

2. The IC die package of claim 1, further comprising:

a frame material adjacent to an edge sidewall of the IC die, the frame material between the heat spreader material and the second region of the package substrate, wherein the heat spreader material is contiguous with the frame material and wherein the frame material has a different composition or microstructure than the heat spreader material.

3. The IC die package of claim 1, wherein the heat spreader material over the second surface of the IC die has a thickness of at least 100 μm.

4. The IC die package of claim 3, wherein the heat spreader material has a thermal conductivity of at least 200 $Wm^{-1}K^{-1}$.

5. The IC die package of claim 4, wherein the heat spreader material comprises at least one of a metal, silicon, or carbon.

6. The IC die package of claim 3, wherein the heat spreader material has a void area percentage of at least 0.1%-0.5%.

7. The IC die package of claim 1, wherein a top surface of the heat spreader material has an RMS surface roughness below 10 μm.

8. The IC die package of claim 1, wherein a top surface of the heat spreader material is substantially planar over both the first region and the second region of the package substrate.

9. The IC die package of claim 8, wherein the heat spreader material has a first thickness over the second surface of the IC die, and a second thickness, greater than the first thickness, over the second region of the package substrate.

10. The IC die package of claim 1, wherein:

the IC die is a first IC die;

the IC die package further comprises a second IC die over a third region of the package substrate, adjacent to the first region; and the heat spreader material is substantially planar over both the first region and the third region of the package substrate.

11. The IC die package of claim 10, wherein the first IC die has a first height from the package substrate and the second IC die has a second height from the package substrate, different than the first height.

12. The IC die package of claim 10, further comprising a thermal break between a first portion of the heat spreader material that is over the first IC die, and a second portion of the heat spreader material that is over the second IC die.

13. The IC die package of claim 12, wherein the thermal break comprises a discontinuity in the heat spreader material.

14. The IC die package of claim 1, wherein the heat spreader material is a solid composition of particles that are contiguous across boundaries between adjacent ones of the particles.

15. The IC die package of claim 14, wherein the heat spreader material comprises voids at the particle boundaries.

16. A computer platform comprising:

a printed circuit board (PCB); and an integrated circuit (IC) die package interconnected to the PCB, the IC die package comprising:

a package substrate;

an IC die having a first surface coupled to a first region of the package substrate; and a heat spreader material contiguous with a second surface of the IC die, opposite the first surface, wherein the heat spreader material extends beyond an edge of the IC die over a second region of the package substrate, wherein the heat spreader material is a solid composition of particles that are contiguous across boundaries between adjacent ones of the particles, and wherein the heat spreader material comprises voids at the boundaries.

17. The computer platform of claim 16, wherein:

the heat spreader material has a void area percentage of 0.1%-0.5%;

the IC die is a first IC die and the IC die package further comprises a second IC die over a third region of the package substrate, laterally adjacent to the first region; and the heat spreader material is contiguous with a surface of the second IC die.

18. The computer platform of claim 17, wherein the heat spreader material comprises a first heat spreader material contiguous with the surface of the first IC die, and a second heat spreader material contiguous with the surface of the second IC die, and wherein a thermal break laterally separates the first and second heat spreader materials.

19. A method of fabricating an IC die heat spreader, the method comprising:

receiving an IC die over a first region of a package substrate; and spray depositing a material onto an exposed surface of the IC die, and over a second region of the package substrate beyond an edge sidewall of the IC die, wherein the spray depositing further comprises entraining a powder comprising particles of the material within a gas jet.

20. The method of claim 19, wherein the spray depositing further comprises cold spraying particles of a material having a thermal conductivity of at least 200 $Wm^{-1}K^{-1}$.

21. The method of claim 20, further comprising:

forming a frame material around a perimeter of the IC die and over the second region; and spray depositing the material onto the exposed surface of the IC die and onto a surface of the frame material.

22. The method of claim 21, wherein forming the frame material comprises at least one of overmolding the frame material or dry film transferring the frame material.

* * * * *